United States Patent
Yun et al.

(10) Patent No.: US 9,431,510 B2
(45) Date of Patent: Aug. 30, 2016

(54) METAL-SEMICONDUCTOR WAFER BONDING FOR HIGH-Q DEVICES

(71) Applicant: QUALCOMM Incorporated, San Diego, CA (US)

(72) Inventors: Changhan Yun, San Diego, CA (US); Chengjie Zuo, San Diego, CA (US); Chi Shun Lo, San Diego, CA (US); Jonghae Kim, San Diego, CA (US); Mario F. Velez, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 91 days.

(21) Appl. No.: 14/554,718

(22) Filed: Nov. 26, 2014

(65) Prior Publication Data

US 2015/0118819 A1   Apr. 30, 2015

Related U.S. Application Data

(62) Division of application No. 13/293,075, filed on Nov. 9, 2011, now Pat. No. 8,907,450.

(51) Int. Cl.
| | |
|---|---|
| *H01L 21/20* | (2006.01) |
| *H01L 29/66* | (2006.01) |
| *H01G 4/33* | (2006.01) |
| *H01L 49/02* | (2006.01) |
| *H01G 4/12* | (2006.01) |

(52) U.S. Cl.
CPC ...... *H01L 29/66174* (2013.01); *H01G 4/1272* (2013.01); *H01G 4/33* (2013.01); *H01L 28/40* (2013.01); *H01L 28/75* (2013.01)

(58) Field of Classification Search
USPC ............. 438/379, 381; 257/532, E21.008, 257/E29.342
See application file for complete search history.

(56) References Cited

U.S. PATENT DOCUMENTS

| | | | |
|---|---|---|---|
| 5,406,447 | A | 4/1995 | Miyazaki |
| 5,439,833 | A | 8/1995 | Hebert et al. |
| 5,559,349 | A | 9/1996 | Cricchi et al. |
| 5,841,182 | A | 11/1998 | Linn et al. |
| 6,380,609 | B1 | 4/2002 | Prinslow et al. |

(Continued)

FOREIGN PATENT DOCUMENTS

| | | |
|---|---|---|
| EP | 0989615 A2 | 3/2000 |
| WO | WO-2011034536 A1 | 3/2011 |

OTHER PUBLICATIONS

International Search Report and Written Opinion—PCT/US2012/064539—ISA/EPO—Feb. 22, 2013.

*Primary Examiner* — Telly Green
(74) *Attorney, Agent, or Firm* — Kenneth K. Vu; Paul Holdaway

(57) ABSTRACT

Methods and apparatus for metal semiconductor wafer bonding for high-Q devices are provided. An exemplary capacitor includes a first plate formed on a glass substrate, a second plate, and a dielectric layer. No organic bonding agent is used between the first plate and the glass substrate, and the dielectric layer can be an intrinsic semiconductor. A extrinsic semiconductor layer that is heavily doped contacts the dielectric layer. The dielectric and extrinsic semiconductor layers are sandwiched between the first and second plates. An intermetallic layer is formed between the first plate and the dielectric layer. The intermetallic layer is thermo compression bonded to the first plate and the dielectric layer. The capacitor can be coupled in a circuit as a high-Q capacitor and/or a varactor, and can be integrated with a mobile device.

8 Claims, 7 Drawing Sheets

(56) References Cited

U.S. PATENT DOCUMENTS

| | | |
|---|---|---|
| 6,890,792 B2 | 5/2005 | Koike et al. |
| 7,297,613 B1 | 11/2007 | Mountain |
| 7,408,434 B2 | 8/2008 | Lee et al. |
| 7,936,205 B2 | 5/2011 | Kong et al. |
| 2009/0272959 A1 | 11/2009 | Phatak et al. |
| 2010/0078758 A1 | 4/2010 | Sekar et al. |
| 2010/0224994 A1 | 9/2010 | Yun |
| 2011/0149477 A1 | 6/2011 | Summey et al. |
| 2012/0074417 A1 | 3/2012 | Nunan et al. |
| 2013/0113076 A1 | 5/2013 | Yun et al. |

METAL-SEMICONDUCTOR WAFER BONDING FOR HIGH-Q DEVICES

CROSS REFERENCE TO RELATED APPLICATIONS

This application is a divisional of U.S. application Ser. No. 13/293,075, entitled "Metal-Semiconductor Wafer Bonding for High-Q Devices," filed on Nov. 9, 2011, which is herein incorporated by reference in its entirety.

FIELD OF DISCLOSURE

This disclosure relates generally to electronics, and more specifically, but not exclusively, to apparatus and methods for metal-semiconductor wafer bonding for high-quality devices.

BACKGROUND

Conventional Metal-Insulator-Metal (MIM) devices, such as MIM semiconductor capacitors, have quality factor (Q) limits due to resistance of thick metal plates with which the conventional MIM devices are fabricated. The thick metal plates resist current flow, which increases the MIM devices' equivalent series resistance (ESR). The high ESR in turn lowers the MIM devices' Q. When the conventional MIM devices are used in radio frequency (RF) circuits, the conventional MIM devices' low-Q restrains performance of the RF circuits and increases the RF circuits' power consumption.

Accordingly, there are long-felt industry needs for device fabrication methods and apparatus that mitigate the problems of the conventional methods and the conventional devices.

SUMMARY

This summary provides a basic understanding of some aspects of the present teachings. This summary is not exhaustive in detail, and is neither intended to identify all critical features, nor intended to limit the scope of the claims.

In an example, methods and apparatus for fabricating a capacitor are provided. A first plate is formed on a glass substrate. The first plate can be formed directly on the glass substrate without using an organic bonding agent. A dielectric layer is formed on a silicon substrate. The dielectric layer can be an intrinsic semiconductor. The first plate is bonded to the dielectric layer with an intermetallic layer using thermo compression. The silicon substrate is doped to form an extrinsic semiconductor layer. A second plate is formed on the extrinsic semiconductor layer. At least a portion of a surface of at least one of the intermetallic layer, the dielectric layer, the extrinsic semiconductor layer, and the second plate can be passivated. The capacitor can be coupled as a high-quality factor capacitor in a circuit. The capacitor can be coupled as a varactor in a circuit. The capacitor can be integrated with at least a part of a mobile device.

In a further example, provided is a non-transitory computer-readable medium, comprising instructions stored thereon that, if executed by a processor, cause a lithographic device to execute at least a part of the aforementioned method.

In an example, provided is a capacitor. The capacitor includes a first plate formed on a glass substrate. In an example, there is no organic bonding agent between the first plate and the glass substrate. The capacitor includes a second plate and a dielectric layer. The dielectric layer can be an intrinsic semiconductor. The capacitor also includes an extrinsic semiconductor layer that is highly-conductive, heavily doped, and adjacent to the dielectric layer. The dielectric layer and the extrinsic semiconductor layer are sandwiched between the first and second plates. An intermetallic layer is formed between the first plate and the dielectric layer. The intermetallic layer is thermo compression bonded to the first plate and the dielectric layer. The capacitor can be coupled in a circuit as a high-quality factor capacitor. The capacitor can be coupled in a circuit as a varactor. The capacitor can be integrated with at least a part of a mobile device.

The capacitor can be integrated in a semiconductor die, and can be integrated into a device, selected from the group consisting of a set top box, music player, video player, entertainment unit, navigation device, communications device, personal digital assistant (PDA), fixed location data unit, and a computer. In a further example, provided is a non-transitory computer-readable medium, comprising instructions stored thereon that, if executed by a lithographic device, cause the lithographic device to fabricate at least a part of the apparatus.

The foregoing has broadly outlined some of the features and technical advantages of the present teachings in order that the detailed description can be better understood. Additional features and advantages are also described in the detailed description. The conception and disclosed embodiments can be readily utilized as a basis for modifying or designing other structures for carrying out the same purposes of the present teachings. Such equivalent constructions do not depart from the technology of the teachings as set forth in the claims. The novel features that are characteristic of the teachings, together with further objects and advantages, are better understood from the detailed description and the accompanying figures. Each of the figures is provided for the purpose of illustration and description only, and does not limit the present teachings.

BRIEF DESCRIPTION OF THE DRAWINGS

The accompanying drawings are presented to describe examples of the present teachings, and are not provided as limitations.

Figure 1:
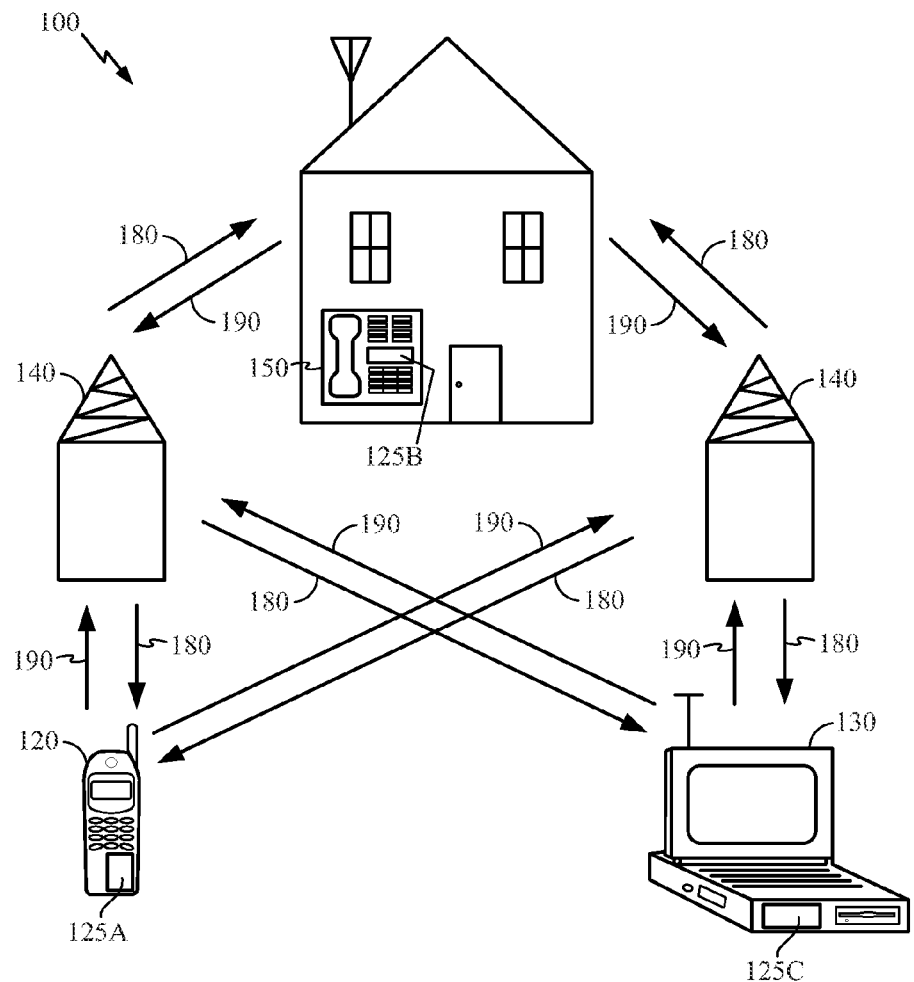
FIG. 1 depicts an exemplary communication system in which an embodiment of the disclosure may be advantageously employed.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Examples of the current teachings are disclosed in this application's text and drawings. The examples advantageously address the long-felt industry needs, as well as other previously unidentified needs, and mitigate shortcomings of the conventional methods and apparatus. Alternate embodiments can be devised without departing from the scope of the invention. Additionally, conventional elements of the current teachings may not be described in detail, or may be omitted, to avoid obscuring aspects of the current teachings.

The word "exemplary" is used herein to mean "serving as an example, instance, or illustration." Any embodiment described as "exemplary" is not necessarily to be construed as preferred or advantageous over other embodiments. Likewise, the term "embodiments of the invention" does not require that all embodiments of the invention include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures.

It should be noted that the terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As employed herein two elements can be considered to be "connected" or "coupled" together by the use of one or more wires, cables, and/or printed electrical connections, as well as by the use of electromagnetic energy, such as electromagnetic energy having wavelengths in the radio frequency region, the microwave region and/or the optical (both visible and invisible) region, as several non-limiting and non-exhaustive examples.

It should be understood that the term "signal" can include any signal such as a data signal, audio signal, video signal, multimedia signal. Information and signals can be represented using any of a variety of different technologies and techniques. For example, data, instructions, process step, commands, information, signals, bits, symbols, and chips that can be referenced throughout this description can be represented by voltages, currents, electromagnetic waves, magnetic fields or particles, optical fields or particles, and/or any combination thereof.

It should be understood that any reference to an element herein using a designation such as "first," "second," and so forth does not generally limit the quantity or order of those elements. Rather, these designations can be used herein as a convenient method of distinguishing between two or more elements or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims means "A or B or C or any combination of these elements."

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the following description, certain terminology is used to describe certain features. The term "mobile device" includes, but is not limited to, a mobile phone, a mobile communication device, personal digital assistant, mobile palm-held computer, a wireless device, and/or other types of portable electronic devices typically carried by a person and/or having some form of communication capabilities (e.g., wireless, infrared, short-range radio, etc.).

INTRODUCTION

Methods and apparatus for metal-semiconductor wafer bonding are provided. In an example, a capacitor includes a CMOS-compatible intermetallic bonding layer that advantageously has a lower resistance than bonding layers found in conventional devices. The lower resistance provides the capacitor with a higher quality factor (Q) than conventional devices, even when the capacitor has metal conductors that are thicker than conventional conductors, thus improving performance and lowering power consumption. The intermetallic bonding layer in the capacitor is non-organic, does not outgas, and does not degrade as quickly as conventional organic adhesives. The intermetallic bonding layer is also more reliable, easier to fabricate, and has better thickness uniformity than the conventional organic adhesives. In examples, some of the exemplary apparatus disclosed herein have a crystalline semiconductor as the capacitor's dielectric, so that the capacitor can be used as a varactor.

DESCRIPTION OF THE FIGURES

FIG. 1 depicts an exemplary communication system 100 in which an embodiment of the disclosure may be advantageously employed. For purposes of illustration, FIG. 1 shows three remote units 120, 130, and 150 and two base stations 140. The wireless communication system 100 can have many more remote units and more base stations. The remote units 120, 130, and 150 include at least a part of an embodiment 125A-C of the disclosure as discussed further herein. FIG. 1 also shows forward link signals 180 from the base stations 140 and the remote units 120, 130, and 150, as well as reverse link signals 190 from the remote units 120, 130, and 150 to the base stations 140.

In FIG. 1, the remote unit 120 is shown as a mobile telephone, the remote unit 130 is shown as a portable computer, and the remote unit 150 is shown as a fixed location remote unit in a wireless local loop system. In examples, the remote units 130 may be a mobile phone, a hand-held personal communication systems (PCS) unit, a portable data unit such as a personal data assistants, a GPS-enabled device, a navigation device, a settop box, a music player, a mobile device, a video player, an entertainment units, or any other device that stores or retrieves data or computer instructions, or any combination thereof. Although FIG. 1 illustrates remote units according to the teachings of the disclosure, the disclosure is not limited to these exemplary illustrated units. Embodiments of the disclosure may be suitably employed in any device which includes active integrated circuitry including memory and on-chip circuitry for test and characterization.

Figure 2:
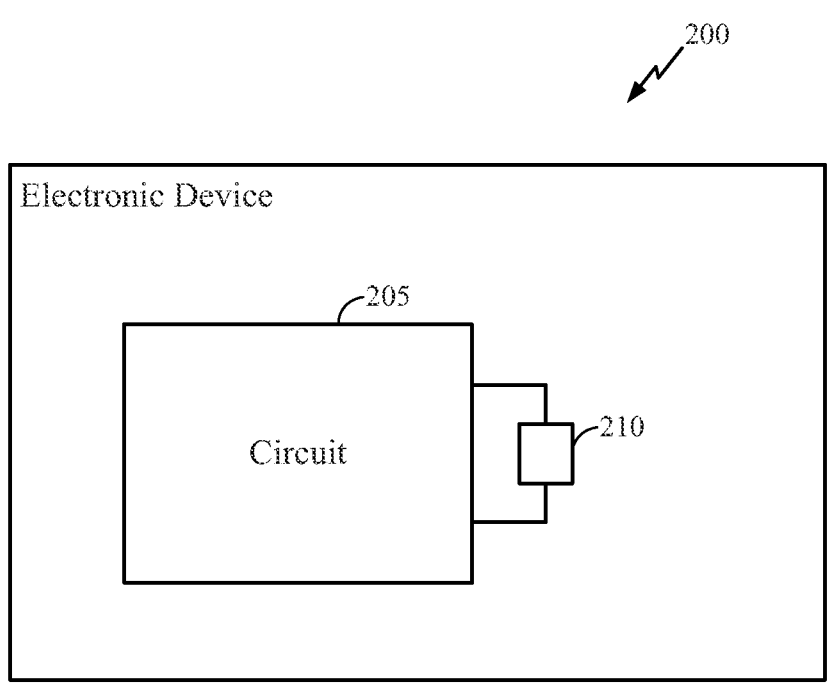
FIG. 2 depicts an exemplary electronic device including a capacitor having a metal-semiconductor wafer bond.

FIG. 2 depicts an exemplary electronic device 200 in which an embodiment of the disclosure can be advantageously employed. The electronic device 200 can be a mobile device, at least one of the three remote units 120, 130, and 150, and/or at least one of the two base stations 140. The electronic device 200 includes a circuit 205 coupled to a capacitor 210 having a metal-semiconductor wafer bond. The capacitors described herein, such as the capacitor 210 can be coupled in a circuit as a high-Q capacitor and/or a varactor having a Q that is improved over conventional Metal-Insulator-Metal (MIM) devices. When coupled to a tuned circuit, the high-Q capacitor and/or the high-Q varactor enables the tuned circuit to have a higher Q, when compared to a conventional tuned circuit. The higher Q in turn reduces phase noise produced by the tuned circuit. For example, when the tuned circuit is a filter, the higher Q varactor provides the filter with greater selectivity than a conventional filter. Further, when the tuned circuit is an oscillator, the higher Q provides lower and slower energy loss than a conventional oscillator, thus saving energy. Thus, if used in a battery-powered device, using the capacitor can advantageously increase battery life.

The circuit 205 to which the capacitor 210 can be coupled and/or integrated with can include, and is not limited to: a radio frequency circuit (e.g., a radio frequency front-end circuit), an audio frequency circuit, a filter (e.g., a tracking filter), a tuner, an oscillator (e.g., a voltage-controlled oscillator), an impedance matching device, a lumped element circuit, a DC blocking circuit, a bypass circuit, a phase-locked loop, a frequency synthesizer, an amplifier, a circuit in a mobile device, a circuit requiring a voltage-controlled variable capacitance, and a coupling circuit.

Figure 3:
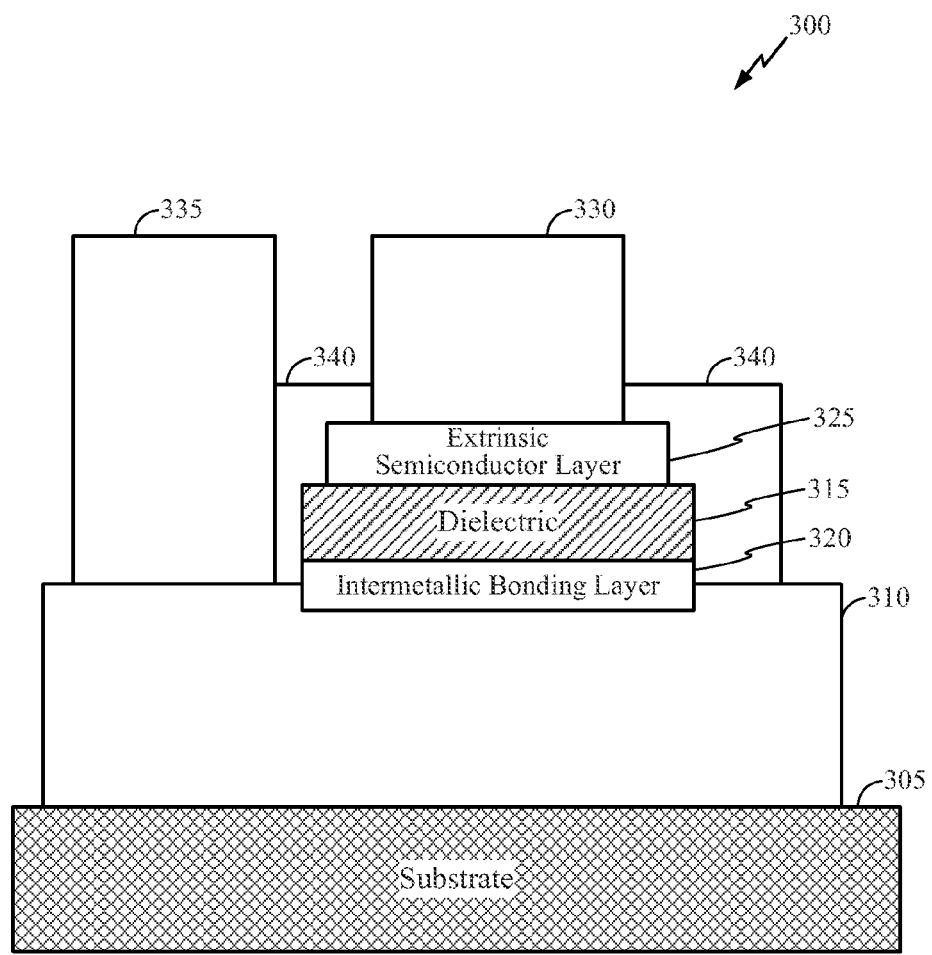
FIG. 3 depicts an exemplary cross-sectional view of a capacitor having a metal-semiconductor wafer bond.

FIG. 3 depicts an exemplary cross-sectional view 300 of the capacitor 210 having a metal-semiconductor wafer bond and a high-Q. The capacitor 210 can also be used as a varactor having a high-Q.

The capacitor 210 is fabricated on a substrate 305, such as a glass plate. The substrate 305 can be fabricated of semiconducting crystalline materials such as silicon, germanium, silicon germanium, gallium arsenide, aluminum gallium arsenide, gallium nitride, indium phosphide, and/or another suitable material suitable for carrying the capacitor.

A first plate 310 is located on the substrate 305. In an example, the first plate 310 is in direct contact with the substrate 305, and no organic bonding agent is used between the first plate 301 and the substrate 305. The first plate 310 can be fabricated of a conductor, such as aluminum, nickel, silver, gold, chromium, molybdenum, tungsten, titanium, platinum, another suitable material, and/or an alloy thereof.

The capacitor 210 includes a dielectric layer 315. The dielectric layer 315 is fabricated of an insulator, such as an intrinsic semiconductor (e.g., epitaxial germanium or silicon). The first plate 310 is thermo compression bonded to the dielectric layer 315 with an intermetallic bonding layer 320. The intermetallic bonding layer 320 reduces the equivalent series resistance (ESR) of the capacitor 210, as compared to conventional devices. The intermetallic bonding layer 320 is an alloy that transitions from a high concentration of the material of the first plate 310 and low concentration of the dielectric material at the first plate 310 to a low concentration of the material of the first plate 310 and high concentration of the dielectric material at the dielectric layer 315. The alloy of the intermetallic bonding layer 320 can include AlGe, AlSi, NiGe$_2$, and/or NiSi$_2$.

An extrinsic semiconductor layer 325 is on the dielectric layer 315. The extrinsic semiconductor layer 325 provides charge carriers that lower the ESR of the capacitor 210. The extrinsic semiconductor layer 325 can be a highly-doped, highly-conductive n+ region. In an example, the dopant is phosphorus.

A second plate 330 of the capacitor 210 is on the extrinsic semiconductor layer 325. The second plate 330 can be fabricated of a conductor, such as aluminum, nickel, silver, gold, chromium, molybdenum, tungsten, titanium, platinum, another suitable material, and/or an alloy thereof.

An optional via 335 contacts the first plate 310 and can be coupled to a wire on a layer other than that of the first plate 310. The via 335 can be fabricated of a conductor, such as aluminum, nickel, silver, gold, chromium, molybdenum, tungsten, titanium, platinum, another suitable material, and/or an alloy thereof.

An optional passivation layer 340 passivizes the first plate 310, the intermetallic bonding layer 320, the dielectric layer 315, the extrinsic semiconductor layer 325, and the second plate 330.

FIGS. 4A-4E depict an exemplary fabrication process 400 for fabricating the capacitor 210 having a metal-semiconductor wafer bond.

Figure 4A:
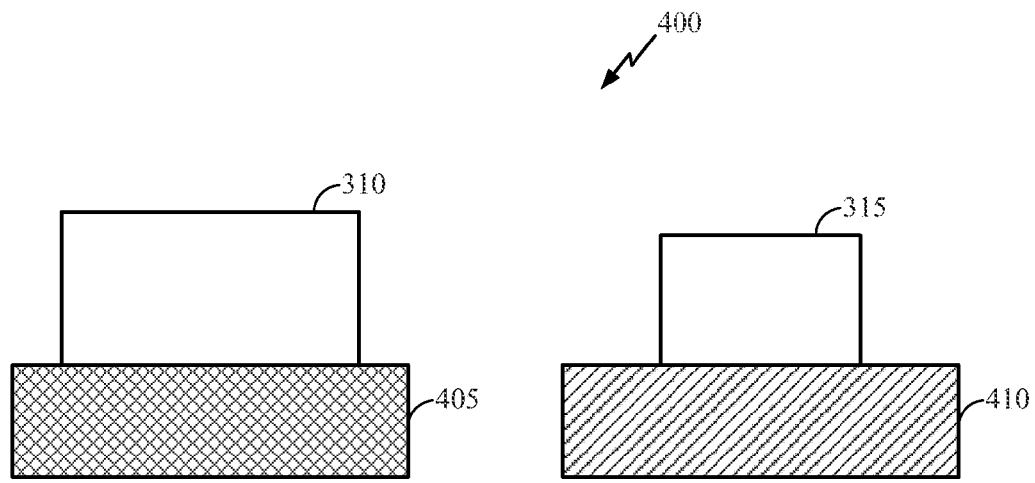
FIGS. 4A-4E depict an exemplary fabrication process for fabricating a capacitor having a metal-semiconductor wafer bond.

FIG. 4A depicts forming the first plate 310 on a glass substrate 405. The first plate 310 can be formed directly on the glass substrate 405 without using an organic bonding agent. FIG. 3A also depicts forming the dielectric layer 315 on a silicon substrate 410. The dielectric layer 315 can be an intrinsic semiconductor, such as epitaxial germanium or silicon. The first plate 310 and the dielectric layer 315 can be fabricated using photolithography or any other appropriate technique.

Figure 4B:
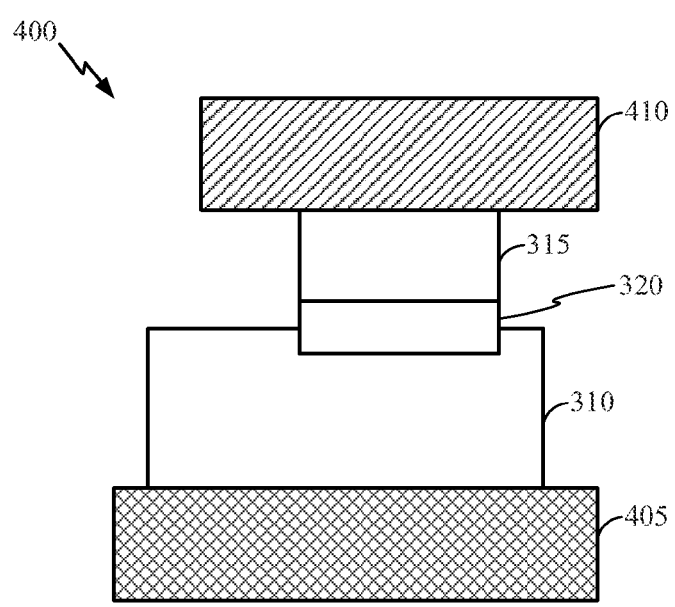

FIG. 4B depicts thermo compression bonding the first plate 310 to the dielectric layer 315, which forms the intermetallic bonding layer 320. Thermo compression bonding includes applying heat while applying mechanical force to hold the first plate 310 to the dielectric layer 315. The heat and mechanical force cause the first plate material and the dielectric material to alloy, thus forming both an electrical bond and a eutectic mechanical bond between the first plate 310 and the dielectric layer 315. The electrical bond forms an interlayer electrical connection. A bonding chamber or any other appropriate device can be used to perform the thermo compression bonding process.

Figure 4C:
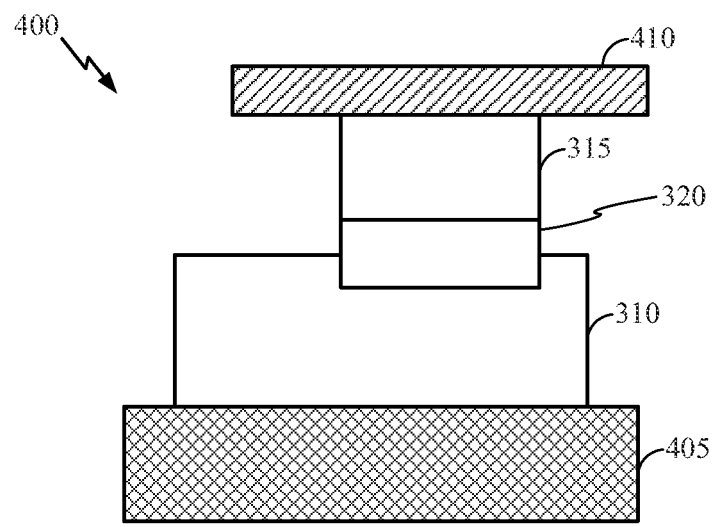

FIG. 4C depicts optional removing of material from the silicon substrate 410 with a removal process. For example, the silicon substrate 410 can be shaped by thinning, milling, grinding, and/or etching.

Figure 4D:
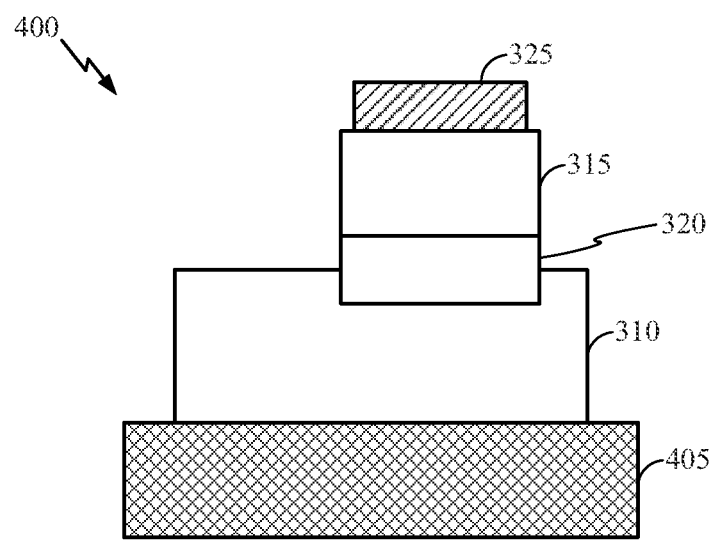

FIG. 4D depicts doping the silicon substrate 410 with a dopant to convert the silicon substrate 410 to an extrinsic semiconductor layer 325. For example, the doping can convert the silicon substrate 410 to an n+ layer. In an example, after doping, the charge carrier concentration is in a range of substantially $10^{17}$ cm$^{-3}$ to substantially $10^{18}$ cm$^{-3}$. The extrinsic semiconductor layer 325 can be fabricated using photolithography, or any other appropriate technique.

Figure 4E:
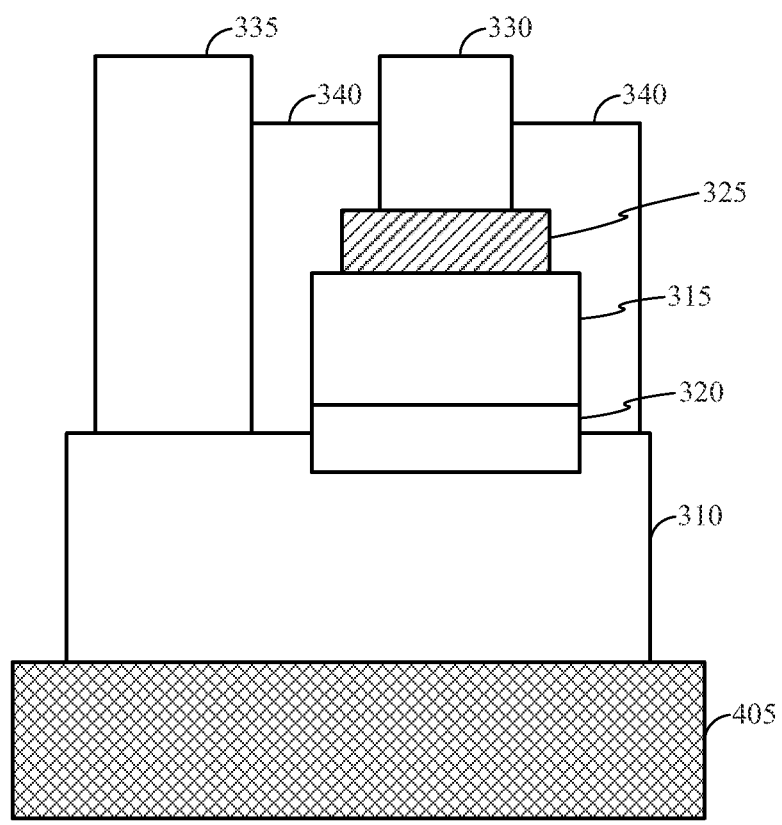

FIG. 4E depicts depositing the second plate 330, depositing the optional via 335, and optionally passivizing the intermetallic bonding layer 320, the dielectric layer 315, the extrinsic semiconductor layer 325, and the second plate 330 with the passivation layer 340. The via 335 provides an electrical feedthrough to couple the first plate 310 to a layer other than that of the first plate 310, and can be fabricated using photolithography or any other appropriate technique. The first plate 310 and the second plate 330 can be electrically coupled to a circuit, such as the circuit 205.

The depositing of materials during the exemplary fabrication process 400 can be performed using, for example, physical vapor deposition, sputtering, chemical vapor deposition, electrochemical deposition, molecular beam epitaxy, atomic layer deposition, and/or another appropriate method.

Figure 5:
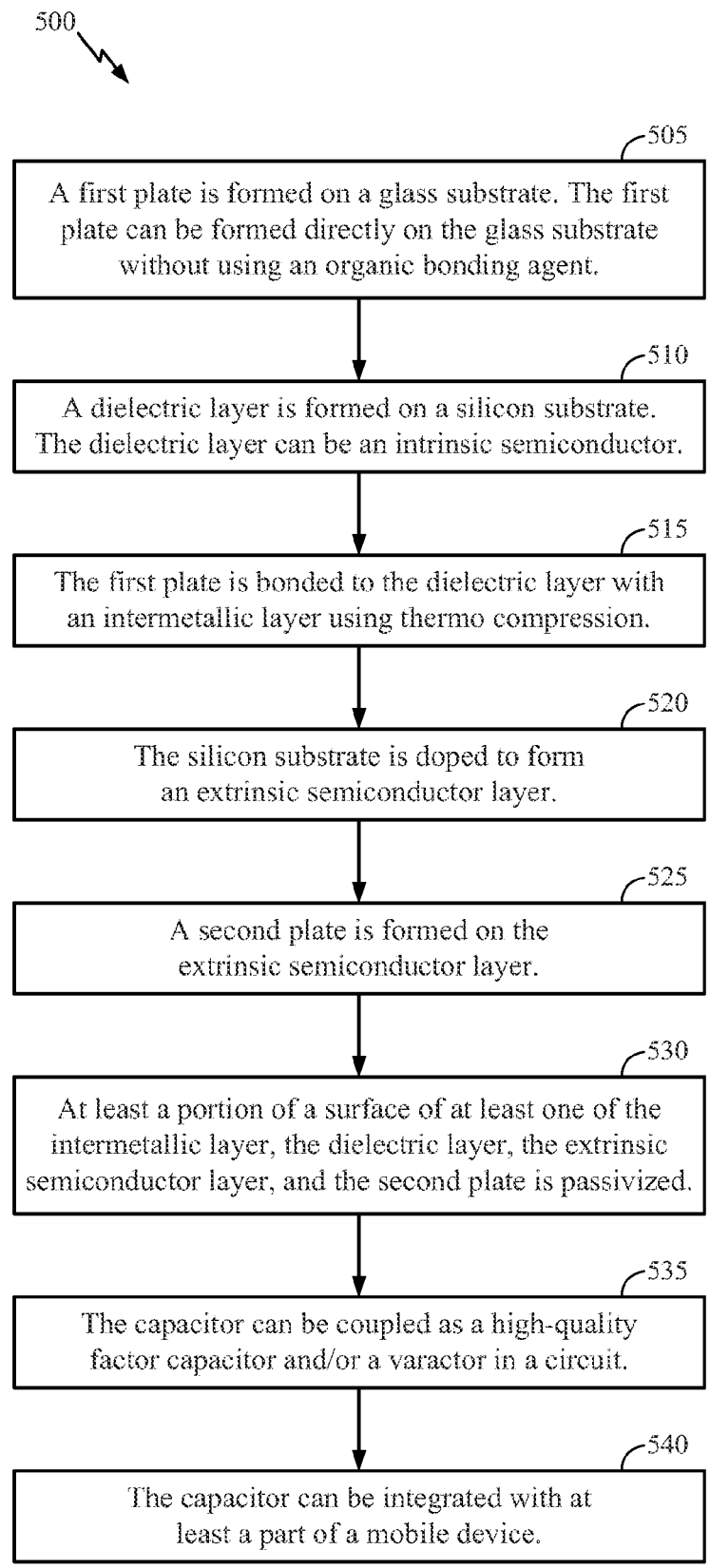
FIG. 5 depicts an exemplary flowchart of a method for fabricating a capacitor having a metal-semiconductor wafer bond.

FIG. 5 depicts an exemplary flowchart 500 of a method for fabricating a capacitor having a metal-semiconductor wafer bond, such as the capacitor 210. The method can be performed, at least in part, by a lithographic apparatus.

In step 505, a first plate is formed on a glass substrate. The first plate can be formed directly on the glass substrate without using an organic bonding agent.

In step 510, a dielectric layer is formed on a silicon substrate. The dielectric layer can be an intrinsic semiconductor.

In step 515, the first plate is bonded to the dielectric layer with an intermetallic layer using thermo compression bonding.

In step 520, the silicon substrate is doped to form an extrinsic semiconductor layer.

In step 525, a second plate is formed on the extrinsic semiconductor layer.

In optional step 530, at least a portion of a surface of at least one of the intermetallic layer, the dielectric layer, the extrinsic semiconductor layer, and the second plate is passivated.

In optional step 535, the capacitor can be coupled as a high-quality factor capacitor and/or a varactor in a circuit.

In optional step 540, the capacitor can be integrated with at least a part of a mobile device.

CONCLUSION

Those having skill in the relevant art will appreciate that information and signals can be represented using any of a variety of different technologies and techniques. For example, data, instructions, process steps, commands, information, signals, bits, symbols, and chips that may be referenced throughout the above description can be represented by voltages, currents, electromagnetic waves, magnetic fields or particles, optical fields or particles, or any combination thereof.

In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM.®, etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Re199, Re15, Re16, Re17) technology, as well as 3GPP2 (e.g., 1xRTT, 1xEV-DO Re10, RevA, RevB) technology and other technologies. The techniques can be used in emerging and future networks and interfaces, including Long Term Evolution (LTE) compatible devices.

The methods, sequences and/or algorithms described in connection with the embodiments disclosed herein can be embodied directly in hardware, in a software module (including instructions) executed by a processor, or in a combination of the two. A software module can reside in RAM memory, flash memory, ROM memory, EPROM memory, EEPROM memory, registers, hard disk, a removable disk, a CD-ROM, or any other form of storage medium. An exemplary storage medium is coupled to the processor such that the processor can read information from, and write information to, the storage medium. In the alternative, the storage medium can be integral to the processor.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored thereon a corresponding set of computer instructions, that upon execution would cause an associated processor to perform the functionality described herein. Thus, the various aspects of the invention can be embodied in a number of different forms, all of which have been contemplated to be within the scope of the claimed subject matter. In addition, for each of the embodiments described herein, the corresponding form of any such embodiments can be described herein as, for example, "logic configured to" perform the described action. An embodiment of the invention can include a computer readable media embodying a method described herein. Accordingly, the invention is not limited to illustrated examples and any means for performing the functionality described herein are included in embodiments of the invention.

The disclosed devices and methods can be designed and configured into GDSII and GERBER computer files that are stored on a computer readable media. These files are in turn provided to fabrication handlers who fabricate devices, based on these files, with a lithographic device. The resulting products are semiconductor wafers that are then cut into semiconductor dice, which are packaged into a respective semiconductor chip. The chip is are then employed in a device, such as a mobile device.

Spatial descriptions (e.g., "top," "middle," "bottom," "left," "center," "right," "up," "down," "vertical," "horizontal," etc.) used herein are for illustrative purposes only, and are not limiting descriptors. Practical implementations of the structures described hereby can be spatially arranged in any orientation providing the functions described hereby. In addition, in using the term "adjacent" herein to describe a spatial relationship between integrated circuit elements, the adjacent integrated circuit elements need not be in direct physical contact, and other integrated circuit elements can be located between the adjacent integrated circuit elements.

Nothing that has been stated or illustrated is intended to cause a dedication of any component, step, feature, object, benefit, advantage, or equivalent to the public, regardless of whether it is recited in the claims. While this disclosure shows exemplary embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order.

What is claimed is:

1. A method for fabricating a capacitor, comprising:
    forming a first plate on a glass substrate;
    forming a dielectric layer on a silicon substrate;
    bonding the first plate to the dielectric layer with an intermetallic layer using thermo compression;
    doping the silicon substrate to form an extrinsic semiconductor layer; and
    forming a second plate on the extrinsic semiconductor layer.

2. The method of claim 1, further comprising passivizing at least a portion of a surface of at least one of the intermetallic layer, the dielectric layer, the extrinsic semiconductor layer, and the second plate.

3. The method of claim 1, wherein the dielectric layer is an intrinsic semiconductor.

4. The method of claim 1, wherein the first plate is formed directly on the glass substrate without using an organic bonding agent.

5. The method of claim 1, further comprising coupling the capacitor as a high-quality factor capacitor in a circuit.

6. The method of claim 1, further comprising coupling the capacitor as a varactor in a circuit.

7. The method of claim 1, further comprising integrating the capacitor with at least a part of a mobile device.

8. A computer program product comprising a computer readable medium, the computer readable medium comprising at least one instruction for causing a lithographic device to perform a method in accordance with any of claims 1 to 7.

* * * * *